United States Patent
Hoda et al.

(10) Patent No.: US 11,303,223 B2
(45) Date of Patent: Apr. 12, 2022

(54) DETECTOR AND POWER CONVERSION APPARATUS

(71) Applicant: Hitachi Automotive Systems, Ltd., Hitachinaka (JP)

(72) Inventors: Isao Hoda, Tokyo (JP); Jia Li, Tokyo (JP); Hiroki Funato, Tokyo (JP); Ryuji Kurihara, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 186 days.

(21) Appl. No.: 16/625,157

(22) PCT Filed: Jun. 1, 2018

(86) PCT No.: PCT/JP2018/021275
§ 371 (c)(1),
(2) Date: Dec. 20, 2019

(87) PCT Pub. No.: WO2018/235572
PCT Pub. Date: Dec. 27, 2018

(65) Prior Publication Data
US 2021/0336558 A1 Oct. 28, 2021

(30) Foreign Application Priority Data
Jun. 23, 2017 (JP) .............................. JP2017-123769

(51) Int. Cl.
*H02M 1/44* (2007.01)
*H02M 7/5387* (2007.01)
(Continued)

(52) U.S. Cl.
CPC .......... *H02M 7/53875* (2013.01); *G01K 7/01* (2013.01); *G01R 19/16538* (2013.01);
(Continued)

(58) Field of Classification Search
CPC .. G01K 7/01; H02M 7/53875; H02M 1/0003; H02M 7/217; H02M 1/123; H02M 1/44; G01R 19/16538
See application file for complete search history.

(56) References Cited

U.S. PATENT DOCUMENTS

| 2013/0060499 A1 | 3/2013 | Yoshimura | |
|---|---|---|---|
| 2017/0151878 A1 | 6/2017 | Okamura | |
| 2017/0179849 A1* | 6/2017 | Yokoi | ................... H02M 7/538 |

FOREIGN PATENT DOCUMENTS

| CN | 2561159 Y | 7/2003 |
|---|---|---|
| CN | 102998017 A | 3/2013 |

(Continued)

OTHER PUBLICATIONS

Machine translation of specification of DE10201505459A1 by Patent Translate, Sep. 2021, 4 pages. (Year: 2021).*
(Continued)

*Primary Examiner* — Harry R Behm
(74) *Attorney, Agent, or Firm* — Crowell & Moring LLP (57) ABSTRACT

Provided is a detector. The detector includes: one or more detection diodes configured to detect a change in an environment of a detection target; a Y capacitor including a plurality of capacitors separately disposed between one end of the detection diodes and a GND and between the other end of the detection diodes and the GND; and a rectifier circuit disposed at least between one end of the detection diodes and the GND or between the other end of the detection diodes and the GND, connected in series with the Y capacitor, and configured to transmit a common-mode current accompanying noise induced in the detection diodes to the GND and cut off a normal-mode loop current that flows between the plurality of capacitors and the detection diodes.

10 Claims, 8 Drawing Sheets

(51) Int. Cl.
 *H02M 1/12* (2006.01)
 *H02M 1/00* (2006.01)
 *G01K 7/01* (2006.01)
 *G01R 19/165* (2006.01)
 *H02M 7/217* (2006.01)

(52) U.S. Cl.
 CPC ......... *H02M 1/0003* (2021.05); *H02M 1/123* (2021.05); *H02M 1/44* (2013.01); *H02M 7/217* (2013.01)

(56) References Cited

FOREIGN PATENT DOCUMENTS

| DE | 102015205459 | A1 | * | 9/2016 | ............... | H02J 1/02 |
|---|---|---|---|---|---|---|
| JP | 2000-307403 | A | | 11/2000 | | |
| JP | 2002-164509 | A | | 6/2002 | | |
| JP | 2002-319837 | A | | 10/2002 | | |
| JP | 2007336728 | A | * | 12/2007 | | |
| JP | 4329829 | B2 | * | 9/2009 | ............ | G01K 7/015 |
| JP | 2010-249687 | A | | 11/2010 | | |
| JP | 2017-103880 | A | | 6/2017 | | |
| WO | WO-2015020306 | A1 | * | 2/2015 | ............... | H02J 1/02 |

OTHER PUBLICATIONS

Machine translation of claims of DE10201505459A1 by Patent Translate, Sep. 2021, 1 page. (Year: 2021) (Year: 2021).*
Chinese-language Office Action issued in Chinese Application No. 201880041700.1 dated Dec. 28, 2020 with English abstract (eight (8) pages).
International Search Report (PCT/ISA/210) issued in PCT Application No. PCT/JP2018/021275 dated Jul. 10, 2018 with English translation (three pages).
Japanese-language Written Opinion (PCT/ISA/237) issued in PCT Application No. PCT/JP2018/021275 dated Jul. 10, 2018 (three pages).

* cited by examiner

DETECTOR AND POWER CONVERSION APPARATUS

TECHNICAL FIELD

The present invention relates to a detector and a power conversion apparatus using the detector.

BACKGROUND ART

JP-A-2010-249687 (PTL 1) is the background art of the technical field. PTL 1 discloses that "In order to provide a physical quantity detection apparatus that can prevent a voltage fluctuation of a detection element caused by common-mode noise and accurately detect a physical quantity, a temperature detection apparatus 1 includes temperature-sensitive diodes 10 to 12, a capacitor 13, resistors 14, 15, a reference power supply 16, and a comparator 18. One end of the temperature-sensitive diodes 10 to 12 is connected via the resistor 14 to a circuit GND insulated from a vehicle housing, and the other end is connected to the comparator 18 via the resistor 15. The capacitor 13 is connected in parallel with the temperature-sensitive diodes 10 to 12. One end of the reference power supply 16 is connected to the circuit GND, and the other end is connected to the comparator 18. Common-mode noise can be prevented by the capacitor 13 and the resistors 14, 15. Therefore, the voltage fluctuation of the temperature-sensitive diodes 10 to 12 caused by the common-mode noise can be prevented, and a temperature can be accurately detected."

PRIOR ART LITERATURE

Patent Literature

PTL 1: JP-A-2010-249687

SUMMARY OF INVENTION

Technical Problem

PTL 1 discloses the physical quantity detection apparatus that can prevent the voltage fluctuation of the detection element caused by common-mode noise and accurately detect the physical quantity. However, the physical quantity detection apparatus of PTL 1 has a problem. That is, during a bulk current injection (BCI) test which simulates superimposition of electromagnetic noise on a high-voltage cable of a power conversion apparatus, in a loop formed by the temperature-sensitive diodes 10 to 12, the capacitor 13, and a parasitic inductance, resonance occurs at a specific frequency, a forward voltage of the temperature-sensitive diodes decreases due to the resonance noise independently of a temperature, and a detection value of a temperature sensor rises significantly, which causes operation of the power conversion apparatus stops.

Therefore, the invention provides a detector and a power conversion apparatus using the detector that can remove common-mode noise superimposed on noise and caused by electromagnetic wave interference, and cut off a normal-mode loop current.

Solution to Problem

To solve the above problems, the invention provides a detector. The detector includes: one or more detection diodes configured to detect a change in an environment of a detection target; a Y capacitor including a plurality of capacitors separately disposed between one end of the detection diodes and a GND and between the other end of the detection diodes and the GND; and a rectifier circuit disposed at least between one end of the detection diodes and the GND or between the other end of the detection diodes and the GND, connected in series with the Y capacitor, and configured to transmit a common-mode current accompanying noise induced in the detection diodes to the GND and cut off a normal-mode loop current that flows between the plurality of capacitors and the detection diodes.

Advantageous Effect

According to the invention, common-mode noise superimposed on noise and caused by electromagnetic wave interference can be removed, and a normal-mode loop current can be cut off.

Problems, configurations, and effects other than those described above will be apparent from the following description of embodiments.

DESCRIPTION OF EMBODIMENTS

Hereinafter, embodiments will be described with reference to the accompanying drawings. In the drawings, the same reference numerals denote the same or corresponding parts. The invention is not limited to the shown embodiments.

First Embodiment

Figure 2:
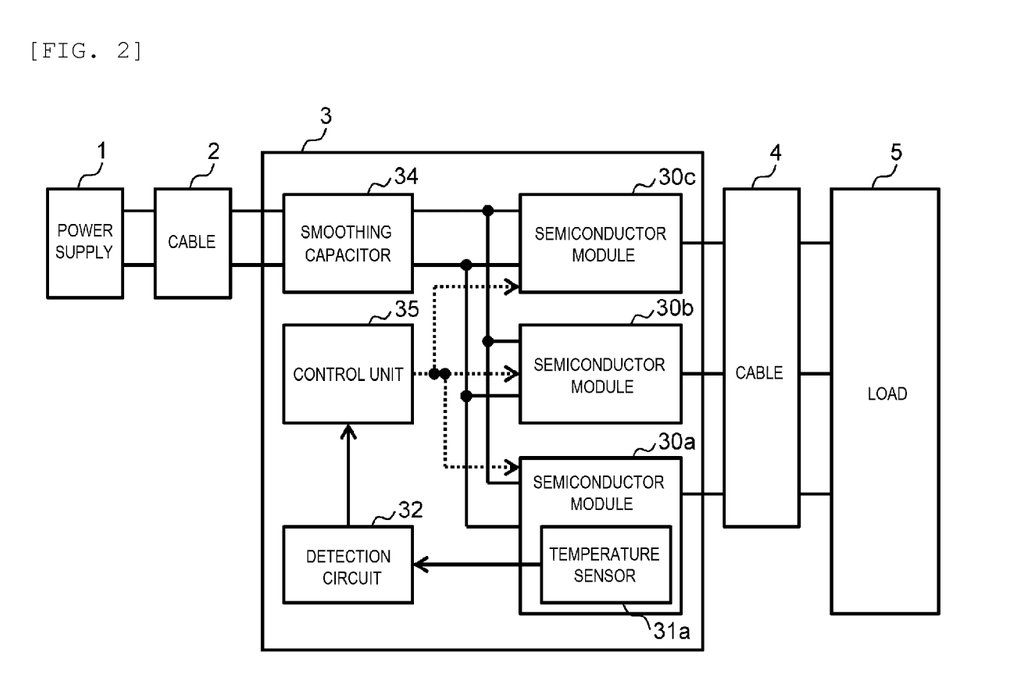
FIG. 2 is a block diagram showing the configuration of a power conversion apparatus according to the first embodiment.
Figure 3:
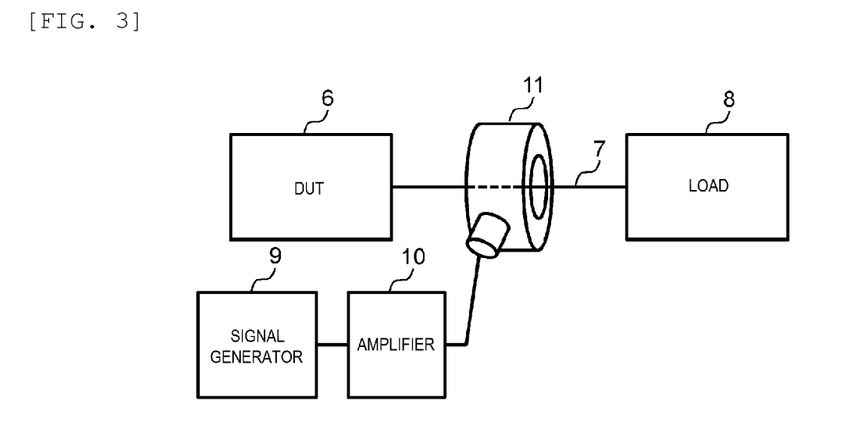
FIG. 3 is a block diagram showing the outline of a BCI test.

In the present embodiment, an example will be described with reference to FIGS. 1 to 3, in which a detection sensor belonging to a detector according to the invention is applied to a temperature sensor that detects a temperature of a semiconductor module. The semiconductor module includes a semiconductor element such as an insulated gate bipolar transistor (IGBT), a metal oxide semiconductor field effect transistor (MOSFET), or SiC that is included in a power conversion apparatus such as a drive inverter for driving a motor of an electric car, a hybrid car and the like.

First, the configuration of a detection sensor mounted on a semiconductor module 30 will be described with reference to FIG. 1. Here, FIG. 1 is a block diagram showing the configuration of a detector according to a first embodiment.

Figure 1:
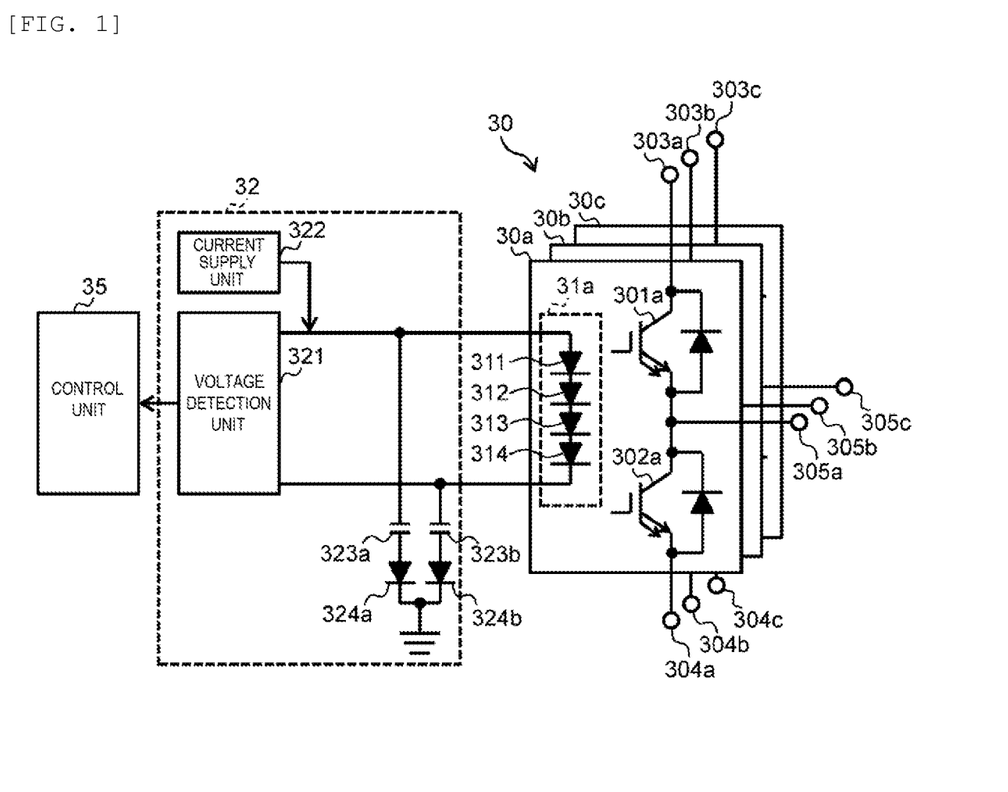
FIG. 1 is a block diagram showing the configuration of a detector according to a first embodiment.

In FIG. 1, a power conversion apparatus on which the detector according to the present embodiment is mounted includes the semiconductor module 30, a semiconductor module temperature detection circuit 32, and a control unit 35. A semiconductor module 30a belonging to the semiconductor module 30 is configured as a metal module that houses semiconductor elements 301a, 302a such as IGBT, MOSFET, and SiC. The semiconductor elements 301a, 302a are inserted between a positive terminal 303a of a high voltage power supply and a negative terminal 304a of the high voltage power supply, and are connected in series with each other. A connection point between the semiconductor element 301a and the semiconductor element 302a is output from the semiconductor module 30a as a switching output 305a.

A semiconductor module 30b belonging to the semiconductor module 30, which is similar to the semiconductor module 30a, includes semiconductor elements 301b, 302b (which are not shown) connected in series with each other, a positive terminal 303b of the high voltage power supply, a negative terminal 304b of the high voltage power supply, and a switching output 305b. A semiconductor module 30c belonging to the semiconductor module 30, which is similar to the semiconductor module 30a, includes semiconductor elements 301c, 302c (which are not shown) connected in series with each other, a positive terminal 303c of the high voltage power supply, a negative terminal 304c of the high voltage power supply, and a switching output 305c.

Here, the semiconductor module 30a includes a temperature sensor 31a, as a detection sensor, that detects a change in an environment around the semiconductor elements 301a, 302a, for example, an ambient temperature of the semiconductor elements 301a, 302a or a temperature of the semiconductor module 30a. A circuit in which one or a plurality of diodes are connected in series with each other is generally used as the temperature sensor 31a, and in the present embodiment, the configuration in which four diodes (detection diodes) 311 to 314 are connected in series with each other is shown as an example. These diodes 311 to 314 are elements whose forward voltages change in accordance with an ambient temperature. Detection information (temperature information) detected by the temperature sensor 31a is output as a total forward voltage of these diodes 311 to 314. For convenience, an anode terminal of the diode 311 is referred to as an anode terminal of the temperature sensor 31a, and a cathode terminal of the diode 314 is referred to as a cathode terminal of the temperature sensor 31a in the present embodiment.

Here, the anode terminal and the cathode terminal of the temperature sensor 31a are separately connected to the semiconductor module temperature detection circuit 32. The semiconductor module temperature detection circuit 32 includes a current supply unit 322 that supplies a current to the anode terminal of the temperature sensor 31a, a voltage detection unit (voltage detector) 321 that detects a forward voltage between the anode terminal and the cathode terminal of the temperature sensor 31a, at least two capacitors 323a, 323b, and at least two rectifier diodes 324a, 324b. At this time, the capacitors 323a, 323b and the rectifier diodes 324a, 324b constitute a detector together with the four diodes (the detection diodes) 311 to 314. The rectifier diodes 324a, 324b constitute a rectifier circuit.

Here, the anode terminal of the temperature sensor 31a is connected to a terminal on one side (one terminal) of the capacitor 323a, and the other terminal of the capacitor 323a is connected to an anode terminal of the rectifier diode 324a. A cathode terminal of the rectifier diode 324a is connected to a GND (a circuit ground) of the semiconductor module temperature detection circuit 32. The GND (the circuit ground) of the semiconductor module temperature detection circuit 32 is set to, for example, a zero voltage value as a reference voltage.

The cathode terminal of the temperature sensor 31a is connected to a terminal on one side (one terminal) of the capacitor 323b, and the other terminal of the capacitor 323b is connected to the anode terminal of the rectifier diode 324b. A cathode terminal of the rectifier diode 324b is connected to the GND (the circuit ground) of the semiconductor module temperature detection circuit 32.

The voltage (the voltage between the anode terminal and the cathode terminal of the temperature sensor 31a) detected by the voltage detection unit 321 is supplied to the control unit 35. The control unit 35 includes a correlation table that previously defines a correlation between a voltage value detected by the voltage detection unit 321 and the temperature of the semiconductor module 30a, and can obtain temperature information on the semiconductor module 30a by referring to the correlation table based on the voltage value detected by the voltage detection unit 321.

Next, an example of the power conversion apparatus on which the semiconductor modules 30a to 30c, the temperature sensor 31a and the semiconductor module temperature detection circuit 32 are mounted will be described with reference to FIG. 2. Here, FIG. 2 is a block diagram showing the configuration of the power conversion apparatus according to the first embodiment. Here, as described above, an inverter that generates an alternating voltage (AC power) from a direct voltage (DC power) is taken as an example. It should be noted that a converter can be used instead of the inverter.

An inverter (the power conversion apparatus) 3 includes the semiconductor modules 30a to 30c including the semiconductor elements such as IGBT, MOSFET, or SiC, the semiconductor module temperature detection circuit 32, the control unit 35, and a smoothing capacitor 34. The smoothing capacitor 34 is connected to a power supply 1 via a cable 2, the semiconductor modules 30a to 30c are connected to a load 5 via a cable 4, and the semiconductor elements 301a to 302c in the semiconductor modules 30a to 30c are switched (switching on and off) to generate a desired voltage or current. The power supply 1 adopts a battery or an AC power supply converted into a DC voltage by a converter. For example, an inverter for driving the hybrid vehicle uses a high-voltage battery of several hundred volts as a power supply. Further, for example, since a medical apparatus such as an X-ray diagnostic apparatus uses a commercial AC power supply, a rectifier circuit or a converter is used to convert the AC power supply into a DC power supply.

A high-frequency switching current and a high-frequency switching voltage are generated from the semiconductor elements 301a to 302c in the semiconductor modules 30a to 30c during switching in accordance with a control signal from the control unit 35. Therefore, the smoothing capacitor 34 is generally used to smooth the switching current and switching voltage. A positive side of the high voltage power supply output from the smoothing capacitor 34 is connected to the positive terminals 303a to 303c of the respective semiconductor modules 30a to 30c. A negative side of the high voltage power supply output from the smoothing capacitor 34 is connected to the negative terminals 304a to 304c of the respective semiconductor modules 30a to 30c. Further, switching outputs 305a to 305c of the semiconductor modules 30a to 30c are separately connected to the load 5 via the cable 4. Here, for example, the load 5 of an inverter for the electric vehicle or the hybrid vehicle is a motor. A three-phase current is generated and the motor is driven by applying the generated three-phase current to the load 5. Switching operation of the semiconductor elements in the semiconductor modules 30a to 30c is controlled by the control unit 35.

At least one of the semiconductor modules 30a to 30c includes the temperature sensor 31a for detecting a temperature in the semiconductor module. The temperature sensor 31a detects a temperature in the semiconductor module 30a during the switching operation. Output of the temperature sensor 31a is detected by the semiconductor module temperature detection circuit (the detection circuit) 32 and the detected output is supplied to the control unit 35. For example, when the temperature in the semiconductor module 30a is higher than a predetermined temperature (when the total forward voltage detected by the temperature sensor 31a (a total forward voltage of the diodes 311 to 314) is larger than a set value), the control unit 35 stops the switching operation of the semiconductor elements 301a to 302c in the respective semiconductor modules in order to prevent damage of the semiconductor module 30a.

At this time, the temperature sensor 31a sets the semiconductor module 30a or the plurality of semiconductor elements 301a to 302a as a detection target, and serves as a component of the detector that outputs a voltage in accordance with an ambient temperature of the detection target. The plurality of semiconductor elements 301a to 302c function as a power converter that converts DC power into AC power by the switching operation. The control unit 35 functions as a controller that controls the switching operation of the plurality of semiconductor elements 301a to 302c, compares an output voltage of the temperature sensor 31a with a set value, and stops the switching operation of the plurality of semiconductor elements 301a to 302c when the output voltage of the temperature sensor 31a is larger than the set value.

Next, the outline of the bulk current injection (BCI) test that is one of immunity tests in the inverter will be described with reference to FIG. 3. FIG. 3 is a block diagram showing the outline of the BCI test. A device under test (DUT) 6 is a measurement target whose immunity is to be evaluated. The DUT 6 is connected to a load 8 via a cable 7. A current injection probe 11 is attached so as to penetrate the cable 7 and inject a current into the cable 7. A signal generator 9 generates a sine wave or an AM modulated signal having predetermined amplitude at a predetermined frequency and supplies the sine wave or the AM modulated signal to an amplifier 10. The amplifier 10 amplifies the supplied signal and supplies the amplified signal to the current injection probe 11. The current injection probe 11 injects a current into the cable 7 by magnetic field coupling.

In the BCI test, the sine wave or the AM modulated current having the predetermined amplitude at the predetermined frequency is injected, by the current injection probe 11, into the cable 7 that connects the DUT 6 to the load 8 as described above, and at that time it is checked whether the DUT 6 operates normally without hindering the desired operation. Here, the desired operation means that, for example, switching of the inverter 3 does not malfunction or a fluctuation in a monitor value of the temperature sensor or a current sensor or the like in the semiconductor module is not larger than a predetermined value.

Next, the outline of operation during the BCI test in which the inverter (the power conversion apparatus) 3 is set as a test target in the present embodiment will be described. Here, a case where one cable in the cable 4 output from the semiconductor module 30a and connected to the load 5 is set as a target of the BCI test will be described. That is, the DUT 6 in the block diagram showing the outline of the BCI test in FIG. 3 is the inverter (the power conversion apparatus) 3 in FIG. 2, and the load 8 in FIG. 3 is the load 5 in FIG. 2.

Here, when a current is injected into the cable 4 by the current injection probe 11, the current is transmitted to the semiconductor module 30a and the load 5. The current transmitted to the semiconductor module 30a is transmitted from the switching output 305a to the semiconductor elements 301a, 302a in the semiconductor module 30a, and is also induced as common-mode noise in the temperature sensor 31a mounted in the same module. Generally, common-mode noise may be removed by performing connection to ground with a Y capacitor. In the semiconductor module temperature detection circuit 32 in the present embodiment, the capacitors 323a, 323b serve as the Y capacitor, whereby common-mode noise can be removed. That is, when common-mode noise is induced in the temperature sensor 31a, a common-mode current that flows through the temperature sensor 31a is transmitted to the GND (the circuit ground) of the semiconductor module temperature detection circuit 32 via the capacitors 323a, 323b.

On the other hand, when the rectifier diodes 324a, 324b are short-circuited without being mounted, a normal-mode loop current flows through a loop formed by the temperature sensor 31a and the capacitors 323a, 323b, and resonance is generated at a specific frequency by the normal-mode loop current. However, the normal-mode loop current can be cut off by inserting the rectifier diodes 324a, 324b into the loop formed by the temperature sensor 31a and the capacitors 323a, 323b. As a result, the resonance at a specific frequency can be prevented.

As described above, according to the first embodiment, in the semiconductor module temperature detection circuit 32, common-mode noise superimposed on the temperature sensor 31a can be removed by the Y capacitor formed by the capacitors 323a, 323b, and the resonance at a specific frequency can be prevented by cutting off the current loop (the normal-mode loop current) by the rectifier diodes 324a, 324b.

Therefore, according to the first embodiment, in the BCI test that simulates electromagnetic noise superimposition on a high-voltage cable, it is possible to prevent a voltage fluctuation in the output of the temperature sensor 31a caused by electromagnetic wave interference. As a result, the common-mode noise caused by the current injected during the BCI test can be removed, the resonance caused by the current loop (the normal-mode loop current) can be prevented, and a fluctuation in the forward voltage of the temperature sensor 31a generated due to the resonance noise can be prevented. Further, even when noise caused by electromagnetic wave interference is induced in the temperature sensor 31a under an environment other than the BCI test, the voltage fluctuation in the output of the temperature sensor 31a can be prevented. As a result, common-mode noise caused by a current induced in the temperature sensor 31a can be removed and the current loop (the normal-mode loop current) can be cut off. According to this effect, fluctuation in a detection value of the temperature sensor 31a can be prevented, and malfunction of the control unit 35 and the inverter 3 can be prevented.

According to the first embodiment, inexpensive chip elements can be used for the capacitors 323a, 323b and the rectifier diodes 324a, 324b, and the inverter (the power conversion apparatus) 3 that can prevent the fluctuation in the detection value of the temperature sensor 31a during the BCI test can be supplied only by an inexpensive additional circuit.

The first embodiment shows an example in which the temperature sensor 31a is mounted in the semiconductor module 30a, but it is apparent that the same effect can be obtained even when the temperature sensor 31a is mounted in another semiconductor module 30b or 30c. The configuration of the inverter (the power conversion apparatus) 3 in which the temperature sensor 31a is only mounted in the semiconductor module 30a has been described. However, the temperature sensor 31a may be mounted in a plurality of manners, such as only in the semiconductor module 30b or the semiconductor module 30c, or in all of the semiconductor modules 30a to 30c, and the same effect can be obtained in any manner.

Second Embodiment

In the present embodiment, a configuration example in which noise removal performance is enhanced by further adding a RC filter as a filter circuit in the semiconductor module temperature detection circuit 32 will be described with reference to FIG. 4.

Figure 4:
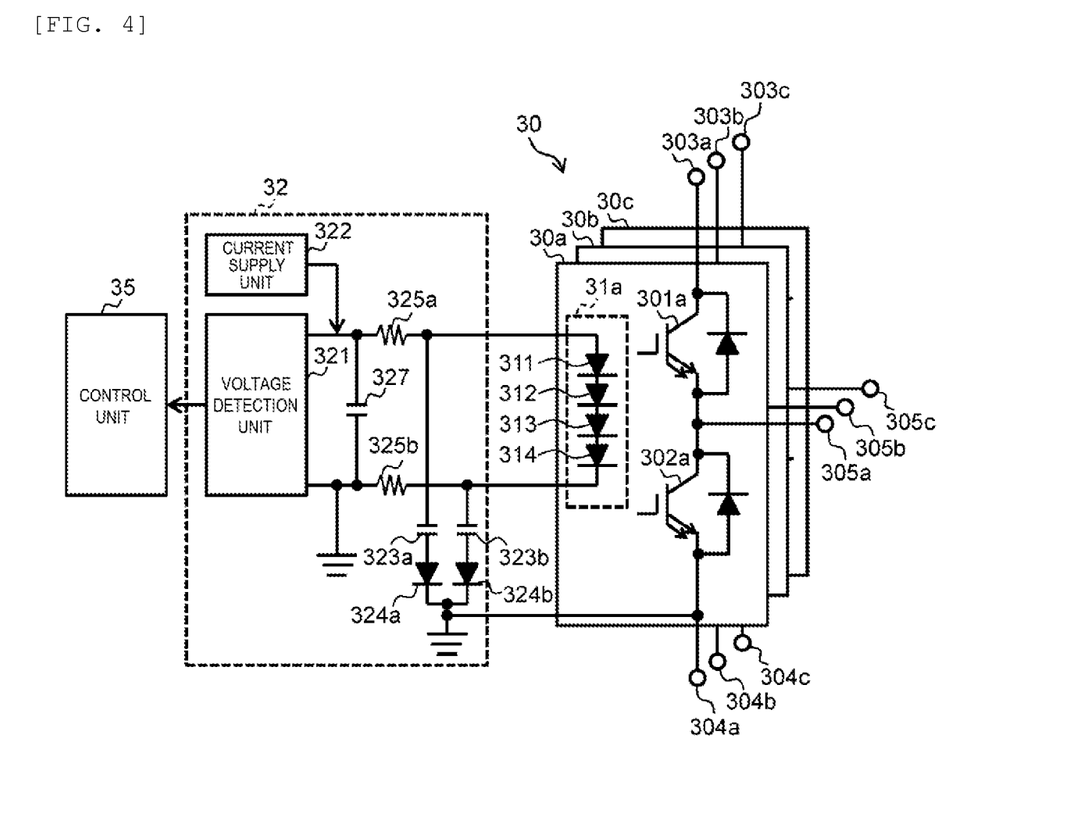
FIG. 4 is a block diagram showing the configuration of a detector according to a second embodiment.

FIG. 4 is a block diagram showing the configuration of a detector according to a second embodiment. The descriptions of the configurations denoted by the same reference numerals as those already shown in FIG. 1 and parts having the same functions in the configuration of the detector in FIG. 4 will be omitted.

The semiconductor module temperature detection circuit 32 of FIG. 1 and the semiconductor module temperature detection circuit 32 of FIG. 4 are different in terms of the following points: (i) a resistor 325a is inserted between an anode terminal of the temperature sensor 31a and the voltage detection unit 321; a resistor 325b is inserted between a cathode terminal of the temperature sensor 31a and the voltage detection unit 321; a capacitor 327 is inserted between input terminals of the voltage detection unit 321; and the RC filter is added as the filter circuit, and (ii) as a GND (circuit ground) of the semiconductor module temperature detection circuit 32, the negative terminal 304a of the high voltage power supply is set as a reference. In this case, the GND (the circuit ground) of the semiconductor module temperature detection circuit 32 is set to a negative voltage value as a reference voltage.

Next, the outline of operation during the BCI test in which the inverter (the power conversion apparatus) 3 is set as a test target in the present embodiment will be described. Here, connection condition of the BCI test is the same as that of the first embodiment. A current injected into the cable 4 by the current injection probe 11 is induced as common-mode noise in the temperature sensor 31a. The common-mode noise is removed by the capacitors 323a, 323b and the rectifier diodes 324a, 324b in the same manner as in the first embodiment, but a part of the common-mode noise is transmitted to the voltage detection unit 321 as normal-mode noise. Therefore, the RC filter can be formed by the resistors 325a, 325b and the capacitor 327, and the normal-mode noise transmitted to the voltage detection unit 321 can be removed. Since the resistors 325a, 325b exist, resonance caused by the capacitor 327 and the temperature sensor 31a does not occur.

According to the second embodiment, the same effect as that of the semiconductor module temperature detection circuit 32 in the first embodiment can be obtained, and the normal-mode noise transmitted to the voltage detection unit 321 can be reduced, so that the inverter (the power conversion apparatus) 3 that can obtain a more accurate temperature detection value can be supplied.

Third Embodiment

In the present embodiment, a configuration example in which a circuit configuration that removes common-mode noise is changed in the semiconductor module temperature detection circuit 32 will be described with reference to FIG. 5.

Figure 5:
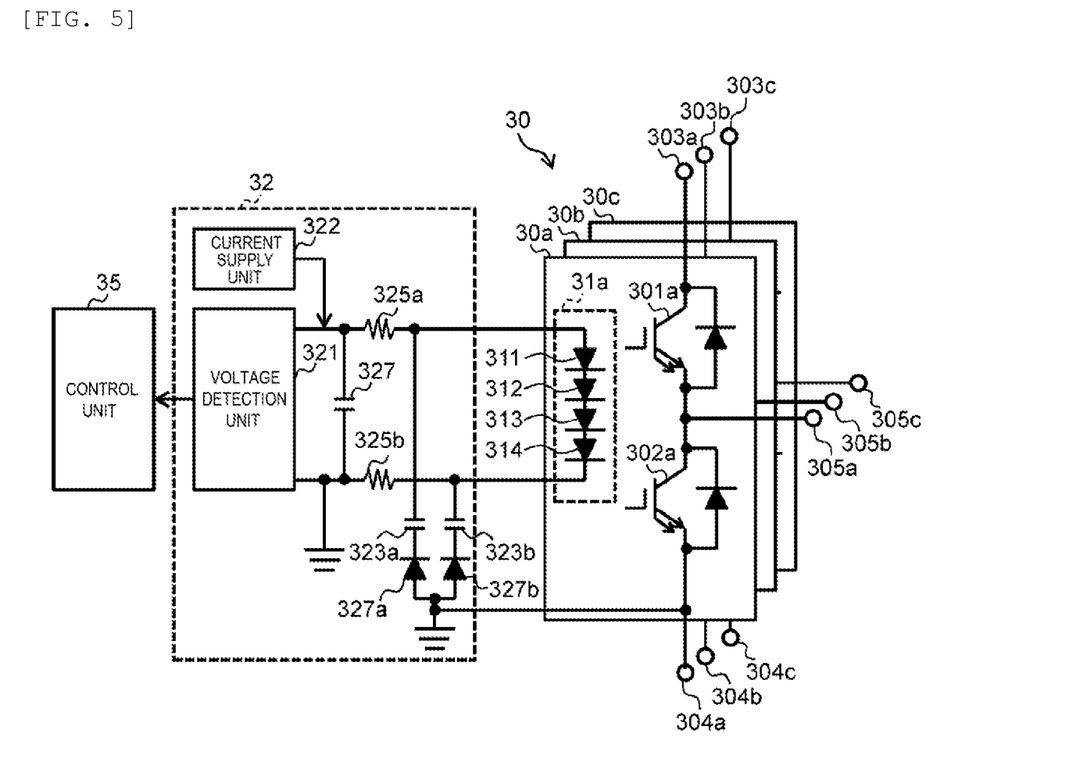
FIG. 5 is a block diagram showing the configuration of a detector according to a third embodiment.

FIG. 5 is a block diagram showing the configuration of a detector according to a third embodiment. The descriptions of the configurations denoted by the same reference numerals as those already shown in FIG. 4 and parts having the same functions in the configuration of the detector in FIG. 5 will be omitted.

The semiconductor module temperature detection circuit 32 of FIG. 4 and the semiconductor module temperature detection circuit 32 of FIG. 5 are different in terms of the following point: a connection direction of the rectifier diodes 324a, 324b in FIG. 4 is reversed; in FIG. 5, an anode terminal of the rectifier diode 327a is connected to GND (circuit ground), and a cathode terminal of the rectifier diode 327a is connected to the capacitor 323a; and an anode terminal of the rectifier diode 327b is connected to the GND (the circuit ground) and a cathode terminal of the rectifier diode 327b is connected to the capacitor 323b.

According to the third embodiment, it is apparent that the function of cutting off a current loop by the rectifier diodes 327a, 327b is not changed, and the same effect as that of the second embodiment can be obtained.

Fourth Embodiment

In the present embodiment, a configuration example in which a circuit configuration that removes common-mode noise is changed in the semiconductor module temperature detection circuit 32 will be described with reference to FIG. 6.

Figure 6:
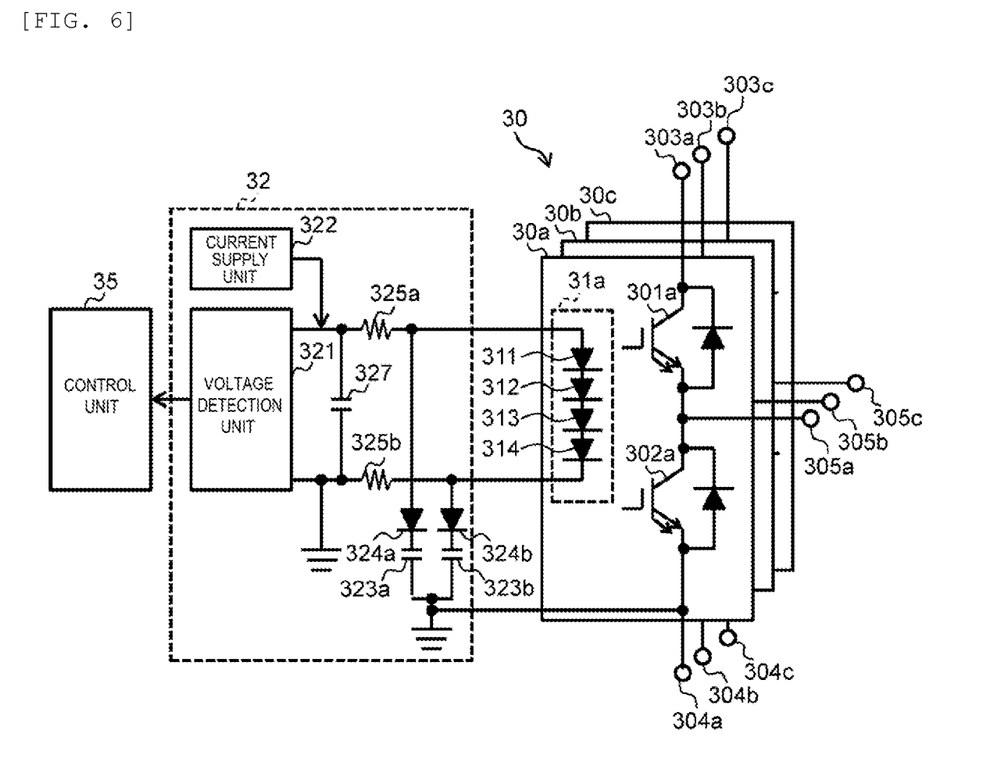
FIG. 6 is a block diagram showing the configuration of a detector according to a fourth embodiment.

FIG. 6 is a block diagram showing the configuration of a detector according to a fourth embodiment. The descriptions of the configurations denoted by the same reference numerals as those already shown in FIG. 4 and parts having the same functions in the configuration of the detector in FIG. 6 will be omitted.

The semiconductor module temperature detection circuit 32 of FIG. 4 and the semiconductor module temperature detection circuit 32 of FIG. 6 are different in the following point: a connection order of the rectifier diode 324a and the capacitor 323a in FIG. 4 is interchanged, and a connection order of the rectifier diode 324b and the capacitor 323b is interchanged. That is, an anode terminal of the rectifier diode 324a is connected to an anode terminal of the temperature sensor 31a, and a cathode terminal of the rectifier diode 324a is connected to the capacitor 323a. The other terminal of the capacitor 323a is connected to GND (circuit ground). Similarly, an anode terminal of the rectifier diode 324b is connected to a cathode terminal of the temperature sensor 31a, and a cathode terminal of the rectifier diode 324b is connected to the capacitor 323b. The other terminal of the capacitor 323b is connected to the GND (the circuit ground).

In this configuration, which is also similar to that of the second embodiment, common-mode noise superimposed on the temperature sensor 31a is removed by a Y capacitor formed by the capacitors 323a, 323b, and resonance at a specific frequency can be prevented by cutting off the current loop by the rectifier diodes 324a, 324b.

According to the fourth embodiment, common-mode noise caused by a current injected during the BCI test is removed, and the resonance caused by the current loop is prevented. Thereby, fluctuation in forward voltage of the temperature sensor 31a that has been generated by resonance noise can be prevented. According to this effect, fluctuation in a detection value of the temperature sensor 31a can be prevented.

Fifth Embodiment

In the present embodiment, a configuration example in which a circuit configuration that removes common-mode noise is changed in the semiconductor module temperature detection circuit 32 will be described with reference to FIG. 7.

Figure 7:
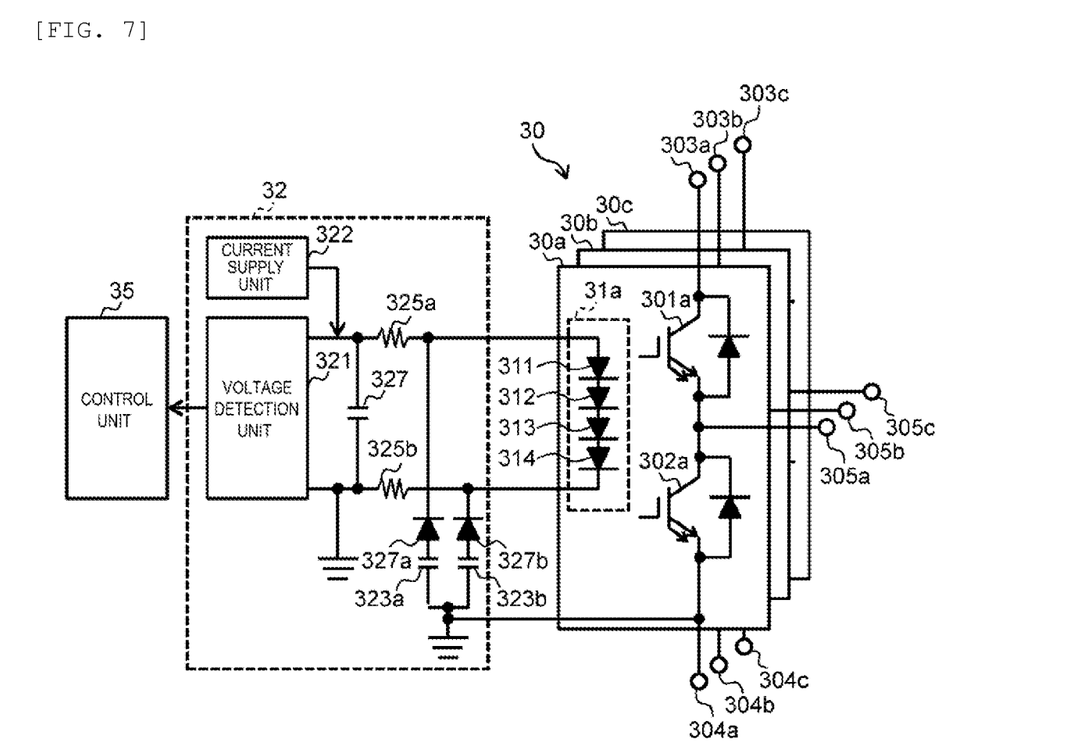
FIG. 7 is a block diagram showing the configuration of a detector according to a fifth embodiment.

FIG. 7 is a block diagram showing the configuration of a detector according to a fifth embodiment. The descriptions of the configurations denoted by the same reference numerals as those already shown in FIG. 6 and parts having the same functions in the configuration of the detector in FIG. 7 will be omitted.

The semiconductor module temperature detection circuit 32 of FIG. 6 and the semiconductor module temperature detection circuit 32 of FIG. 7 are different in terms of the following point: a connection direction of the rectifier diodes 324a, 324b in FIG. 6 is reversed; in FIG. 7, a cathode terminal of the rectifier diode 327a is connected to an anode terminal of the temperature sensor 31a, and an anode terminal of the rectifier diode 327a is connected to the capacitor 323a; and a cathode terminal of the rectifier diode 327b is connected to a cathode terminal of the temperature sensor 31a, and an anode terminal of the rectifier diode 327b is connected to the capacitor 323b.

According to the fifth embodiment, it is apparent that the function of cutting off the current loop by the rectifier diodes 327a, 327b is not changed, and the same effect as that of the fourth embodiment can be obtained.

Sixth Embodiment

In the present embodiment, a configuration example in which a position where a circuit that removes common-mode noise is mounted is changed will be described with reference to FIG. 8.

Figure 8:
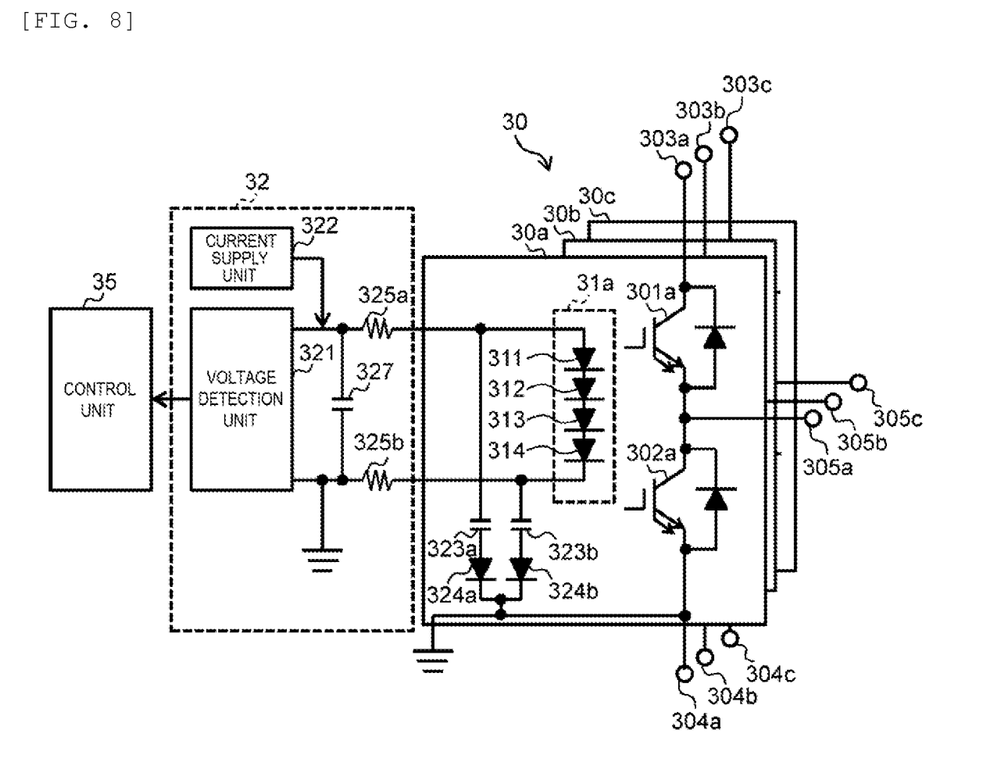
FIG. 8 is a block diagram showing the configuration of a main part of a detector according to a sixth embodiment.

FIG. 8 is a block diagram showing the configuration of a detector according to a sixth embodiment. The descriptions of the configurations denoted by the same reference numerals as those already shown in FIG. 4 and parts having the same functions in the configuration of the detector in FIG. 8 will be omitted.

In the present embodiment, the capacitors 323a, 323b and the rectifier diodes 324a, 324b, which are components of the semiconductor module temperature detection circuit 32, are mounted in the semiconductor module 30a, and a connection configuration of the components is the same as that of FIG. 4.

According to the sixth embodiment, it is apparent that the function of cutting off the current loop by the rectifier diodes 324a, 324b is not changed, and the same effect as that of the second embodiment can be obtained. According to the sixth embodiment, it is possible to take measures to remove common-mode noise and cut off the current loop (a normal-mode loop current) in the semiconductor module 30a.

The invention is not limited to the embodiments described above and includes various modifications. For example, even when only one of the rectifier diodes 324a, 324b (or the rectifier diodes 327a, 327b) is inserted in loops (two current loops that flow in different directions) formed by the temperature sensor 31a and the capacitors 323a, 323b (or the rectifier diodes 327a, 327b), one of the two current loops can be cut off. The embodiments described above have been described in detail for easy understanding of the invention, and the invention is not limited to those having all the configurations described above. A part of the configuration of one embodiment can be replaced with the configuration of another embodiment, and the configuration of another embodiment can be added to the configuration of one embodiment. A part of the configuration of each embodiment may be subjected to addition, deletion and replacement of another configuration.

A part or all of the configurations described above, functions, processing units, processing means, and the like may be realized by hardware, for example, by designing an integrated circuit. The above-described configurations, functions, and the like may also be realized by software by interpreting and executing programs that realize respective functions by a processor. Information such as a program, a table, a file, and the like for realizing each function can be stored in a recording apparatus such as a memory, a hard disk, or a solid state drive (SSD), or in a recording medium such as an IC card, an SD card, or a DVD.

Control lines and information lines are considered to be necessary for explanation, and all control lines and information lines are not necessarily shown in the product. In practice, it may be considered that almost all the configurations are connected to each other.

REFERENCE SIGN LIST 1 power supply
2, 4, 7 cable
3 inverter (power conversion apparatus)
5, 8 load
6 DUT
9 signal generator
10 amplifier
11 current injection probe
30a, 30b, 30c semiconductor module
301a to 301c semiconductor element
302a to 302c semiconductor element
303a to 303c positive terminal of high voltage power supply
304a to 304c negative terminal of high voltage power supply
304a to 304c switching output
31a temperature sensor
311 to 314 diode
32 semiconductor module temperature detection circuit
321 voltage detection unit
322 current supply unit
323a, 323b, 327 capacitor
324a, 324b, 327a, 327b rectifier diode
34 smoothing capacitor
35 control unit

The invention claimed is:
1. A detector comprising:
one or more detection diodes configured to detect a change in an environment of a detection target;
a Y capacitor including a plurality of capacitors separately disposed between one end of the detection diodes and a GND and between the other end of the detection diodes and the GND; and a rectifier circuit disposed at least between the one end of the detection diodes and the GND or between the other end of the detection diodes and the GND, connected in series with the Y capacitor, and configured to transmit a common-mode current accompanying noise induced in the detection diodes to the GND and cut off a normal-mode loop current that flows between the plurality of capacitors and the detection diodes, wherein
the rectifier circuit includes a plurality of rectifier diodes, each anode terminal of the plurality of rectifier diodes is connected to the GND, one cathode terminal of the plurality of rectifier diodes is connected to one end of the detection diodes via one capacitor of the plurality of capacitors, and another cathode terminal of the plurality of rectifier diodes is connected to the other end of the detection diodes via another capacitor of the plurality of capacitors.

2. The detector according to claim 1, wherein
a filter circuit configured to remove normal-mode noise induced in the detection diodes is connected to both ends of the detection diodes.

3. The detector according to claim 1, wherein
the GND is set to a zero voltage value or a negative voltage value as a reference voltage.

4. The detector according to claim 1, wherein
the detection diodes, the Y capacitor, and the rectifier circuit are disposed in a module that houses the detection target of the detection diodes.

5. A power conversion apparatus comprising:
a power converter configured to convert DC power into AC power or convert the AC power into the DC power by switching operation of a plurality of semiconductor elements;
the detector according to claim 1, wherein the detector configured to output a voltage in accordance with an ambient temperature of a detection target, the detection target being the plurality of semiconductor elements; and
a control unit configured to control the switching operation of the plurality of semiconductor elements, compare the output voltage of the detector with a set value, and stop the switching operation of the plurality of semiconductor elements when the output voltage of the detector is larger than the set value.

6. A detector comprising:
one or more detection diodes configured to detect a change in an environment of a detection target;
a Y capacitor including a plurality of capacitors separately disposed between one end of the detection diodes and a GND and between the other end of the detection diodes and the GND; and
a rectifier circuit disposed at least between the one end of the detection diodes and the GND or between the other end of the detection diodes and the GND, connected in series with the Y capacitor, and configured to transmit a common-mode current accompanying noise induced in the detection diodes to the GND and cut off a normal-mode loop current that flows between the plurality of capacitors and the detection diodes, wherein
the rectifier circuit includes a plurality of rectifier diodes, one cathode terminal of the plurality of rectifier diodes is connected to one end of the detection diodes, one anode terminal of the plurality of rectifier diodes is connected to the GND via one capacitor of the plurality of capacitors, another cathode terminal of the plurality of rectifier diodes is connected to the other end of the detection diodes, and another anode terminal of the plurality of rectifier diodes is connected to the GND via another capacitor of the plurality of capacitors.

7. The detector according to claim 6, wherein
a filter circuit configured to remove normal-mode noise induced in the detection diodes is connected to both ends of the detection diodes.

8. The detector according to claim 6, wherein
the GND is set to a zero voltage value or a negative voltage value as a reference voltage.

9. The detector according to claim 6, wherein
the detection diodes, the Y capacitor, and the rectifier circuit are disposed in a module that houses the detection target of the detection diodes.

10. A power conversion apparatus comprising:
a power converter configured to convert DC power into AC power or convert the AC power into the DC power by switching operation of a plurality of semiconductor elements;
the detector according to claim 6, wherein the detector configured to output a voltage in accordance with an ambient temperature of a detection target, the detection target being the plurality of semiconductor elements; and
a control unit configured to control the switching operation of the plurality of semiconductor elements, compare the output voltage of the detector with a set value, and stop the switching operation of the plurality of semiconductor elements when the output voltage of the detector is larger than the set value.

* * * * *